United States Patent [19]

Haney et al.

[11] 4,191,919

[45] Mar. 4, 1980

[54] FAST NMR ACQUISITION PROCESSOR

[75] Inventors: Richard M. Haney; Robert A. Stillman, both of Palo Alto; Robert S. Codrington, Los Altos Hills, all of Calif.

[73] Assignee: Varian Associates, Inc., Palo Alto, Calif.

[21] Appl. No.: 907,650

[22] Filed: May 22, 1978

[51] Int. Cl.² ......................................... G01R 33/08
[52] U.S. Cl. ................................... 324/312; 324/307
[58] Field of Search .......... 324/0.5 R, 0.5 A, 0.5 AC

[56] References Cited

U.S. PATENT DOCUMENTS

| | | | |
|---|---|---|---|
| 3,711,764 | 1/1973 | Ernst | 324/0.5 R |
| 3,873,909 | 3/1975 | Ernst | 324/0.5 A |
| 3,968,423 | 7/1976 | Hoshino | 324/0.5 AC |

*Primary Examiner*—M. Tokar
*Attorney, Agent, or Firm*—Stanley Z. Cole; Edward H. Berkowitz

[57] ABSTRACT

A Fourier transform NMR spectrometer incorporates a digital acquisition processor which provides a sequence of gating states specifying properties of the excitation, decoupling, and homogeneity spoiling pulses, lock channel operation and the like. Each gating state, together with the selected persistance time for the corresponding state, occupies one of a sequence of words supplied by the acquisition processor to a FIFO buffer. Timing control means, initialized from the persistance time portion of the current FIFO word, determines the time interval during which said gating state information is available at an output port, after which the next sequential FIFO word is advanced to the output port. NMR response is accumulated and averaged in a dual port fast semiconductor memory. The semiconductor memory is independently accessible to a host computer through a direct memory port. After each data block of a predetermined number of transients has been so processed, the entire updated cumulative spectrum is copied into non-volatile storage to secure the data against loss or distortion.

10 Claims, 2 Drawing Figures

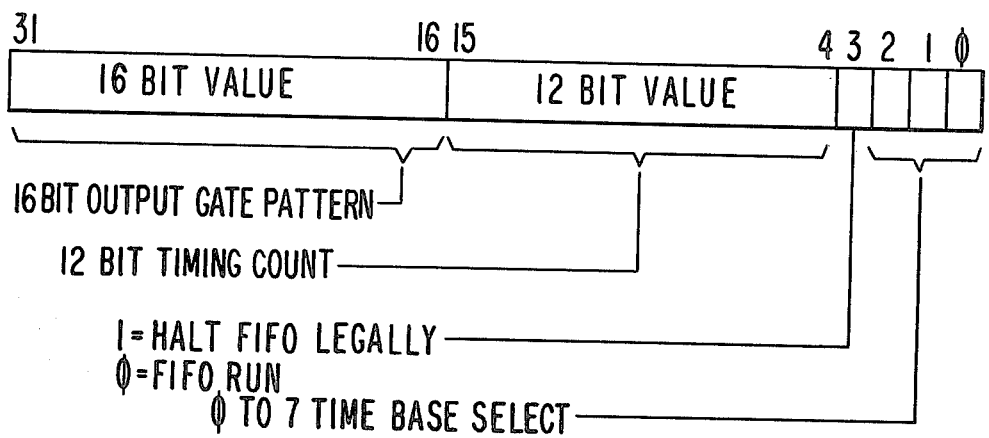

FAST NMR ACQUISITION PROCESSOR

BACKGROUND OF THE INVENTION

This invention relates generally to NMR spectroscopy and particularly to the data acquisition and control aspects of NMR spectroscopy apparatus.

NMR spectroscopy by the Fourier transform method has proven to be a prolific analytical technique. Such instrumentation virtually compels a computer-based system in order to accommodate the requirements of the method and to retain flexibility. A modern Fourier transform spectrometer has the capability to supply excitation pulses to the sample under study which may vary in phase, duration, interval between pulses; auxiliary transients such as decoupling pulses, homogeneity spoiling pulses, and control functions such as receiver and transmitter gating, analog-to-digital conversion commands and the like. These operations provide only for the bare acquisition of data. Time averaging, storage, transformation to the time domain, background analysis, online display and hard copy output are another class of operations which necessarily place demands on computational effort. A still further class of data handling is encountered in the evaluation and interpretation of data, comparison of data to theory and other high-level operations.

In the prior art, these classes of operations have been most commonly accommodated by an interrupt-based system architecture employing a processor which was interrupted in its current task by a task of higher priority requiring servicing, after which the processor restored conditions ante interrupt and returned to the interrupted task. The efficiency of such apparatus is never maximal for any task regardless of the priority assignment and considerable effort is required to establish and maintain such a system.

Fourier transform spectrometers achieve statistical precision by a large number of repetitions of the excitation-detection cycle. The currently acquired digitized data increments (actually a digitized waveform) are added to the previously acquired signals at addresses corresponding to values of the independent variable (time). Thus an averaged time domain spectrum (or averaged waveform) evolves in the memory. The introduction of semiconductor random access memory (RAM) elements makes it economically feasible to provide fast, large memories for this purpose. While the economy and technical specifications for these components are desirable, contemporary semiconductor RAM is volatile an does not retain information in the event of power failure or severe power transients. As a consequence, very long data acquisition runs for the measurement of low intensity spectral features may result in a complete loss of data in the event of power disturbance. Ordinarily, standby battery power is required to preserve the memory content under such conditions. This in turn requires periodic maintenance to insure viability and additionally adds to the original and operating costs of the instrument.

In the prior art, pulse sequence generation for NMR spectroscopy has been implemented by a digital computer employing both software and hardware elements cooperating in varying degrees to present the gating signal to the desired device. The gate signal from the computer would have the desired time separation from the preceding gate and the desired persistence interval. The combination of the control function with the processing of the NMR response has been commonly implemented with a priority interrupt based computer system. Distinct limitations in both data acquisition rate capability and further computational operations on the data characterize such systems. A general discussion of such apparatus may be found in Shaw, "Fourier Transform N.M.R. Spectroscopy", (Elsevier Scientific Publishing Company, 1976). In addition, at high incidence of interrupts, difficulties are encountered in maintaining the synchronism of the excitation and waveform digitization with respect to the time reference.

BRIEF DESCRIPTION OF THE INVENTION

It is an object of the present invention to provide an improved data acquisition apparatus for Fourier transform NMR spectroscopy.

In one feature of the present invention, the real time data acquisition functions are controlled by a first digital processor which develops sequences of states characterizing an NMR spectrometer.

In another feature of the present invention sequences of spectrometer pulse gating states are represented by binary words consecutively stored in a FIFO buffer together with corresponding binary information specifying the persistence interval for the corresponding state whereby the timing registration of each state of the acquisition sequence is prescribed.

In yet another feature of the present invention the content of the FIFO buffer is advanced in response to a master clock and count-down circuits initialized in accord with said persistence interval information whereby the time dependence of the acquisition sequence is realized independently of the activity of said first processor.

Again, in another feature of the invention, digitized NMR signals are averaged and stored by said first processor through a first port of a dual port volatile semiconductor memory whereby a cumulative time domain spectrum is developed.

In still another feature of the invention, after each block of data comprising a predetermined number of transients, the cumulative time domain spectra updated by such block are written into a non-volatile memory through the second port of said dual port semiconductor memory without perturbing the critical timing registration of the acquisition sequence whereby the cumulative data is preserved at a recent known stage of acquisition and data loss is minimized.

In the present invention, such spectrometer functions as RF pulse phase, decoupling parameters, homogeneity spoiling, analog-to-digital convertor control, lock channel operation, transmitter and receiver gating and the like are controlled, each by a respective gate ultimately selected by a dedicated acquisition processor. An output port comprising a set of latches therefore describes the state of the apparatus at any given time in accord with a binary gating state word, each bit of which commands a distinct spectrometer function. A sequence of gating states and their respective durations are specified in a corresponding series of binary words. Each word specifies a particular state and its prescribed duration in respective sub-fields. These words are loaded into an advancing sequence buffer register for sequential presentation of the content of the state sub-field to the output port. The advancing sequence buffer comprises a plurlity of uni-directionally serially communicating registers for advancing a sequence of digital words obtained in the registers toward an output register. Thus, the advancing sequence buffer is commonly known as a "first-in first-out" or FIFO register. The clocking of the FIFO is controlled by a count-down circuit initialized from the duration or persistence subfield. The FIFO content therefore specifies a portion of a complete cycle of data acquisition. Such a cycle may comprise excitation pulses at various durations, phases and intervals therebetween, receiver gating and digital conversion command signals, decoupling pulses, homogeneity spoiling pulses, and the like. These command gates may be presented to the spectrometer in the desired sequence and timing at speeds which can greatly exceed (in bursts) the data rate of the dedicated processor.

The features and advantages of the present invention will become apparent from the following description of a preferred embodiment of the invention illustrated in the accompanying drawings wherein:

BRIEF SUMMARY OF THE DRAWINGS

FIG. 2 illustrates the format of the FIFO word of the preferred embodiment.

DETAILED DESCRIPTION OF THE INVENTION

Figure 1:
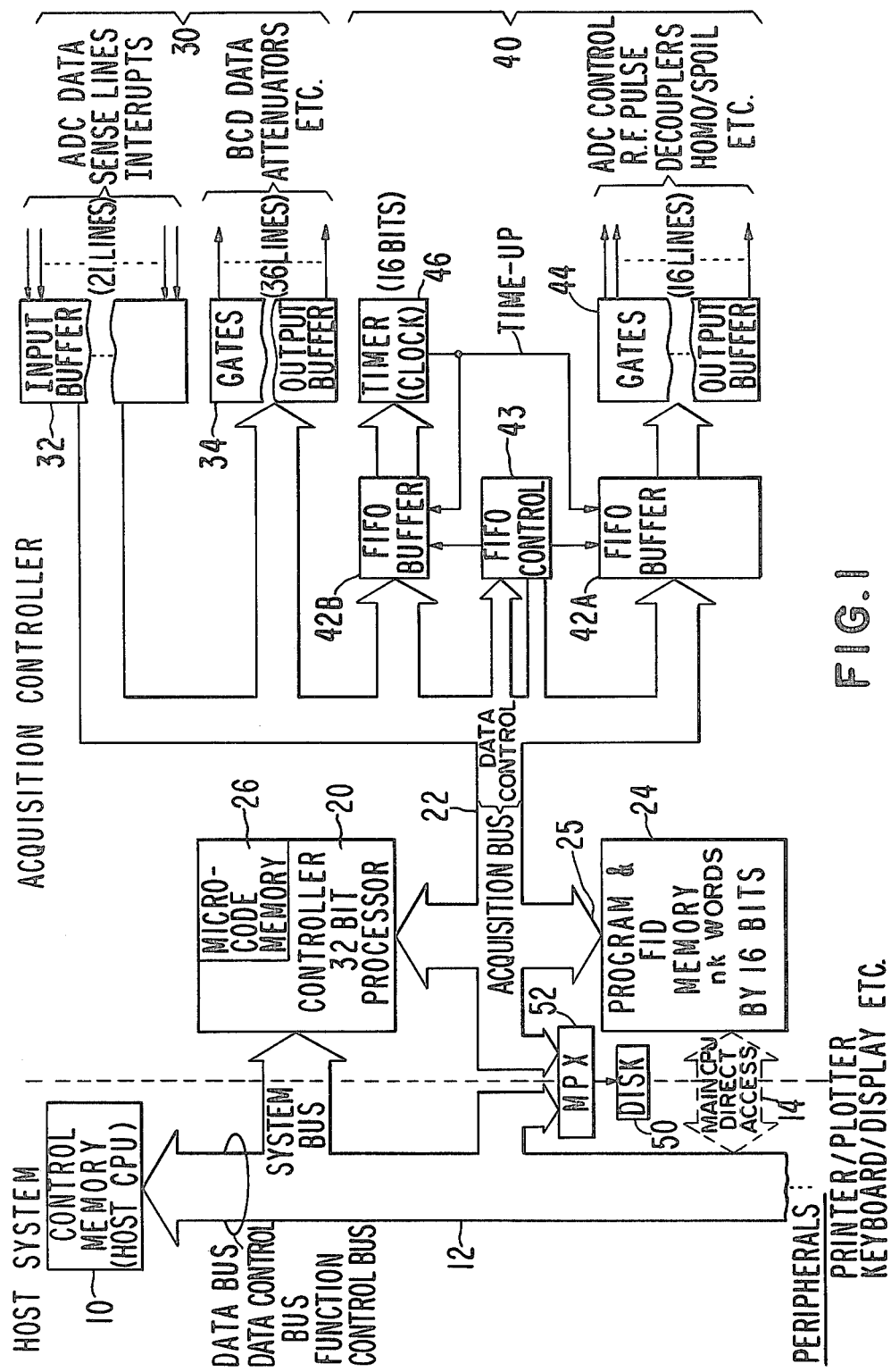
FIG. 1 shows a block diagram of the acquisition system of the present invention.

Turning now to FIG. 1, a preferred embodiment of the present invention is shown in block form. Two processors are distinguished; a "host" computer 10 which may be a general purpose digital computer, as for example a V-77 Data Machine manufactured by Sperry-Rand Corporation, and a dedicated system acquisition processor (SAP) 20 which may be another general purpose computer, microprocessor, or specially designed bit slice microprocessor. The SAP 20 communicates with the host 10 over the host system buss 12 and independently communicates on acquisition buss 22 with a number of interface components to be described and with the acquisition data memory 24 through a first memory access port 25. The latter memory may be separately accessed by the host computer 10, preferably via direct memory access facility without interruption of the SAP 20. The data memory 24 stores the acquisition program executed by the acquisition procesor 20 as well as the NMR data processed thereby. The system acquisition processor 20 also comprises a microcode memory 26 for implementing its instruction repertoire and preferably includes special purpose routines: the latter include, for example, routines to service interrupts arising from current ADC data transfers to the processor 20, from assertion of FIFO status flags requiring attention and routines for information transfer between the SAP 20 and the host 10 over the system buss 12 and for transferring data between memory 24 and an external memory as described below.

SAP input-output interface 30 includes input interface 32 for receiving the digital data generated by devices not shown including one or more analog to digital converters (ADC), sense lines and interrupts over the SAP buss 22. An output interface 34 is provided which is ordinarily used for limited purposes such as presentation of BCD data, configuring commands to set operating parameters in external devices, and the like. Outputs which are periodically asserted in the excitation-detection cycle are implemented through the FIFO interface 40.

A typical processor to implement the role of acquisition processor 20 is able to generate pulse sequence at rates of the order of 0.5 MHz. Experimental requirements for modern FT-NMR spectroscopy require capability for command pulses at much higher instantaneous rates. Accordingly, the present invention incorporates a FIFO register stack to achieve command gate burst rate capability to 20 MHz from the relatively slower acquisition processor 20, and to minimize interrupt servicing requirements for the acquisition processor 20. FIFO "stacks" are well known in the art. In the preferred embodiment a FIFO comprising 16 words of 32 bits each is employed to present gating state sequences in bursts of up to 15 distinct command gating patterns at burst rates limited only by clocking of the FIFO-Timer combination. The FIFO interface 40 employs a FIFO register stack, each word of which comprises a gating state portion 42A of 16 bits and persistence portion 42B of 16 bits. The FIFO stack may be implemented by any means for retaining a sequence of words and advancing the words in sequential order on command to an output location where the information contained in the currently available word is accessible to further processing. FIFO control 43 synchronizes the input to the FIFO stack 42A and 42B and the output therefrom, maintains pointers to the input and output addresses of the FIFO stack 42 and further controls and monitors the FIFO states of START, STOP, and conditions such as underflow (FIFO empty) and overflow (FIFO full). The FIFO interface 40 further includes output latches and gating interface 44 and FIFO timer 46 described in greater detail below.

It will be recalled that a Fourier transform NMR spectrometer is controlled as to the excitation of the resonance system and acquires data as a response to this excitation. The excitation control function often forms a repetitive cycle of excitation pulses of varying parameters such as pulse duration, phase, interval between pulses, as well as application of special transient fields to accomplish decoupling, homogeneity spoiling and the like. The variety of diverse experiments which are achievable in this manner is specified as a sequence of states for the relevant apparatus components. In the present invention, each of 16 components or spectrometer functions are assigned a binary digit(s) to select such function. Thus, a binary field of 16 bits may specify the state of 16 output lines each actuating a control subfunction of the spectrometer. The time dependence of the control state is specified by another binary subfield which is interpreted as the presistance time for the specified state. Table 1 below, summarizes the preferred assignment of subfunctions in such a state designating subfield. The value of each indicated bit (0 or 1) controls the assertion or non-assertion of the corresponding gate or selection code. The assignment of the gates and selection codes to the indicated functions are not exclusive, but represent typically desired capabilities for an FT-NMR spectrometer.

TABLE I

| GATING STATE DEFINITIONS | |
|---|---|
| Bit | Gating Command |
| 0 | Transmitter gate |
| 1 | Receiver gate |
| 2 | Decoupler pulse |
| 3 | 90° RF pulse |
| 4 | 180° RF pulse |
| 5 | ADC sampling phase |
| 6 | ADC sampling phase |

TABLE I-continued
GATING STATE DEFINITIONS

| Bit | Gating Command |
|---|---|
| 7 | ADC command to convert |
| 8 | Lock channel select |
| 9 | Quadrature - not quadrature select |
| 10 | Decoupler modulation selection |
| 11 | Decoupler modulation selection |
| 12 | Homogeneity spoiling pulse |
| 13 | 90° decoupler pulse |
| 14 | 180° decoupler pulse |
| 15 | Decoupler power select (high/low) |

The functions controlled by the gating state bit assignments of Table I are well known in the art of FT-NMR spectroscopy and my be more fully described in the literature; see for example, Shaw, op.cit. Disregarding the particular assignments of Table 1, it is apparent that up to $2^{16}-1$ values can be presented for state specification. The particular function assignments of Table 1 suggest a rather more limited set of states in that a number of bit combinations are incompatible and would not ordinarily be asserted concurrently. For example, the transmitter gate and receiver gate would not normally be asserted at the same time. Similarly, consecutive states may have logical or device determined limitations. For example, ADC conversion commands follow, rather than precede excitation pulses in the excitation-acquisition cycle.

Turning now to FIG. 2, a preferred format is shown for a 16 bit persistence time subfield of a complete state specification word having characteristics and mantissa portions. Bits 0-2 specify a time base characteristic, n, spanning the values $10^{-n}$ seconds where $n=2...7$. A basic timing unit of 50 nanoseconds (corresponding to the FIFO clock rate) is assumed for the value $n=0, 1$. Bit 2 is a halt bit. Bits 4-15 inclusive, provide a 12 bit mantissa which, in conjuction with the time base, characteristic serves to initialize timer 46 (FIG. 1) which incorporates a countdown circuit operative from an isolated output of a 20 MHz system clock forming part of timer 46. When the interval specified is terminated, the sequential content of FIFO buffer 42A—42B has advanced to present the next FIFO word to the ouput latches 44 and timer 46. The isolation of the timer 46 preserves the integrity of time intervals to a fixed time reference while relative synchronism of the processor 20 is permitted. Illustrative of internal conflicting requirements which could adversely affect time relationship of spectrometer commands to the master clock of the processor memory, accesses of SAP 20 to RAM 24 can be delayed for any reason, e.g., refresh cycle, current access by host 10 in progress, etc.

The independent roles of host computer 10 and SAP 20 are emphasized in the system of the present invention. Data acquisition and experiment control are conducted over bus 22. Thus, the host computer 10 is insulated from frequent interrupts arising from completion of the digital conversion of the currently acquired datum. The SAP 20 is, in effect, co-dedicated to processing the free induction decay (FID) signal and to establishing the gate state sequence generation; because these aspects of SAP operation are substantially non-overlapping in time, the SAP 20 may operate at peak efficiency with minimum idle time. The host computer 10 initiates SAP programs and experimental parameters, modifies SAP operation and monitors the SAP status. Periodically, during the course of the spectral measurement, the SAP 20, copies the cumulative time domain spectrum from volatile semiconductor RAM to non-volatile memory. The latter may be for example magnetic disc storage well-known in the art. The host also operates upon the cumulative time domain spectrum to effect the Fourier Transformatin to the frequency domain. These operations pertain to the currently accumulating data; overhead and host execution time for these purposes is slight, permitting the host computer 10 to plot previously acquired spectra, or to otherwise enable operation on such spectram e.g. background subtraction, peak integration, etc. It will be observed that this architecture is enabled by the two-port memory 24 shared by the SAP 20 and the host 10. Memory 24 is commonly realized from semiconductor RAM components which are more or less volatile; under loss of power or severe power disturbance, the memory elements will not retain information. In the preferred embodiment the host 10 is a V-77 computer manufactured by Sperry-Univac, communicating with the common dual port (V-77 type) memory 24 through one port while the SAP 20 accesses the memory through the other port.

In the preferred embodiment acquisition processor 20 has been realized from standard components such as Microprogram Control Unit 3001, sixteen Central Processing Elements 3002 and six Programmable read-only memories 3624, all products of Intel Corp., Santa Clara, Calif. Together with necessary clocks, power supplies, and modest additional logic, a 32 bit processor is implemented in known fashion.

In operation the host computer accepts keyboard input from the experimentor specifying the experiment or string of experiments. This input may simply call up standard data acquisition templates from the host system library or implement a specially tailored acquisition program(s). This code, executable by the SAP 20 resides in a portion of RAM 24. Another portion of RAM 24 is set aside for the accumulation of spectral data. When control is established in the SAP 20, the host 10 is available for other tasks, which include monitoring keyboard inputs for modification of operations of the SAP 20. Meanwhile the SAP 20 carries out its initialization procedures which include loading the FIFO stack 42A-42B. After issuing a START command to the FIFO interface, the content of the FIFO interface 42 is presented to output latches 44 sequentially with such persistance times as are contained in each timing portion 42B of each gating state word. Having initiated the FIFO START, the SAP 20 is free to pursue other tasks. After the initial excitation sequence, the FIFO will in due course present a succession of gating states to cause digital conversion by the ADC of the FID signal at correspondingly successive time intervals. When a given analogue to digital conversion has been comtpleted, the ADC strobes its data to the input interface 32 and causes an interrupt to the SAP 20 for ADC servicing. As noted above, the processor 20 is not continuously active in formulating gating state words because it need only insure that the FIFO interface 40 is reloaded periodically. Conversion commands to the ADC are given at precisely spaced time intervals governed by the persistance time field of the gating state which asserts the conversion command. A sequence of conversion commands may be so generated to effect digitization of the FID signals at desired sampling intervals, over a selected spctral width consistent with memory size and other parameters. For example, the maximum sampling rate is limited by the time required by the ADC to effect conversion of a maximum size magnitude signal to the conversion precision selected. Accordingly, the persistance time for ADC conversion gates is always greater than this minimum. For a preferred ADC, 13 bit precision is achieved for a ±10 volt sample in 12μ seconds; 7 bit precision required 14μ seconds. Samples are ordinarily spaced over much longer intervals than these limits providing substantial opportunity for the processor 20 to reset and release the ADC, process the current datum, check for imminent overflow of any memory location holding the cumulative time domain spectrum, and to perform other house keeping tasks before returning from the interrupt service routine. The processor 20 must occasionally reload the FIFO stacks 42 to maintain this sequence.

After the elapse of each n transients, the processor 20 initiates a transfer of the cumulative spectrum to non-volatile memory as previously noted. In the preferred embodiment the SAP 20 communicates directly with magnetic disk 50 through buss multiplexer 52. In this manner, the SAP 20 and host 10 share access to disk memory 50 in analogy to the shared access to (volatile) memory 24. Sense lines and interrupts communicating with the spectrometer are employed to indicate to the processor 20 the status of spectrometer components which could induce spectral artifacts or distort the spectrum, facilitating such action as the processor program specifies. A simple example of such action is termination of data acquisition to preserve the cumulative spectrum currently residing in non-volatile storage. A more complex routine may result in the initiation of remedial action. For example, a sense line or interrupt indicating loss of field-frequency lock may independently initiate a field-frequency search mode in apparatus such as described in copending application Ser. No. 896,410, (assigned to the present assignee) or like apparatus. The data, rendered suspect thereby, may be discarded and the FIFO interface 40 re-initialized to resume data acquisition after the processor 20 confirms that the field-frequency lock is re-established. In general, the system of the present invention has the ability to analyze and modify its operation to preserve the integrity of the cumulative spectrum. Still more complex actions are clearly within the capability of the programmer having average skill in the art.

Since many changes can be made in the above-described invention and many apparently widely different embodiments of this invention could be made without departing from the scope thereof, it is intended that all matter contained in the above descrioption and shown in the accompanying drawings shall be interpreted as illustrative and not in a limiting sense.

What is claimed is:

1. In an impulse NMR spectrometer comprising a digital processor to generate gating commands for excitation of resonance and control data acquisition functions of said spectrometer, the improvement comprising:
 a FIFO register for containing a sequence of gating state words, each said word having a first portion for selecting the status of gates responsive to said gating commands and a second portion specifying the time interval for the persistance of said gating state word, said sequence of gating state words supplied by said digital processor,
 output latch means for asserting said gating commands responsive to the first portion of the currently asserted gating state word of said FIFO register, and
 timing means responsive to said second portion of said gating state word for advancing the next sequential gating state word to said output means at the expiration of the persistence inteval of the currently asserted gating state word.

2. The apparatus of claim 1 wherein each said gating state word comprises 32 bits.

3. The apparatus of claim 1 wherein the second portion of said gating state word comprises a count field for specifying the numer of time increments and a time base field for establishing the length of such increments.

4. In an impulse NMR spectrometer including a digital processor having volatile memory means for additive accumulation of a spectral distribution from a plurality of transient excitations and a data path between said processor and a processor access port of said volatile memory:
 non-volatile memory means for retaining said spectral distribution,
 information transfer means for communication between said volatile memory means and non-volatile memory means, said information transfer means comprising another access port for said volatile memory means and another data path beween said another access port and said non-volatile memory.

5. The apparatus of claim 4 wherein said data transfer means comprises another processor for controlling transfers of information between said volatile and non-volatile memory.

6. A method for the protection of cumulative spectral distribution data, said data acquired in statistical increments of an averaged spectral measurement and accumulated in a volatile memory means, comprising the steps of:
 accepting a digitized input datum representative of said spectral distribution and updating a counter recording the number of such data received,
 processing such datum to update the spectral distribution,
 detecting the receipt of a preselected number of data forming said selected statistical increment of said average spectra measurement, and
 responsive to said detection, copying the current cumulative spectral distribution from said volatile memory means to non-volatile memory means, whereby said spectral distribution comprising m−1 statistical increments of data is preserved against failure of said volatile memory, said failure occurring during the $m_{th}$ increment of data.

7. The method of maintaining synchrony in a spectrometer for excitation-data acquisition cycles of a preselected sequence of spectrometer states, said method comprising:
 encoding said pre-selected sequence of states in a corresponding sequence of digital words, each said word comprising a state selection portion and a duration portion,
 storing at least a portion of said sequence of digital state selection words in a corresponding sequence of addresses in a memory adaped to serially advance the content of each said memory address to an output position,
 commanding said spectrometer in accord with said state selection portion of said digital word occupying said output position, initializing a timing apparatus in response to the content of said duration portion of said digital word occupying said output position and retaining said digital word in said output position for the specified duration, advancing the content of each said memory address to said output position at the termination of said specified duration.

8. The method of claim 7 comprising:

generating an underflow signal indicative of the presence in said output position of the last word of said portion of said sequence of digital state selection words whereby another portion, if any, of said selected sequences may be transmitted to said serially advanceable memory.

9. The method of claim 8 comprising the repetition of said steps of storing, commanding, initializing and retaining, and advancing.

10. The method of claim 8 comprising halting said sequence in response to a digital word specifying the termination of said selected sequence of spectrometer states.

* * * * *